United States Patent [19]

Ohmura

[11] 4,294,651

[45] Oct. 13, 1981

[54] METHOD OF SURFACE-TREATING SEMICONDUCTOR SUBSTRATE

[75] Inventor: Sohshi Ohmura, Kawasaki, Japan

[73] Assignee: Fujitsu Limited, Kawasaki, Japan

[21] Appl. No.: 150,686

[22] Filed: May 16, 1980

[30] Foreign Application Priority Data

May 18, 1979 [JP] Japan .................. 54-61228

[51] Int. Cl.³ .................... C09K 13/02; C09K 13/08; H01L 21/306
[52] U.S. Cl. .................. 156/662; 252/79.3; 252/79.5
[58] Field of Search .......... 252/79.3, 79.5; 156/647, 629, 662; 228/123, 164; 427/307

[56] References Cited

U.S. PATENT DOCUMENTS

| | | | |
|---|---|---|---|
| 3,309,760 | 3/1967 | Reznick et al. | 228/123 |
| 3,791,948 | 2/1974 | Dixon et al. | 156/662 |
| 3,833,435 | 9/1974 | Logan et al. | 156/662 |
| 3,930,065 | 12/1975 | Baker et al. | 427/307 |
| 3,936,331 | 2/1976 | Luce et al. | 156/647 |
| 3,986,251 | 10/1976 | Altemus et al. | 228/123 |
| 4,043,861 | 8/1977 | Jacob et al. | 156/662 |
| 4,049,488 | 9/1977 | Tijburg | 156/662 |
| 4,100,014 | 7/1978 | Kuhn-Kuhnenfeld | 156/662 |
| 4,137,123 | 1/1979 | Bailey et al. | 156/647 |
| 4,147,564 | 4/1979 | Magee et al. | 156/647 |
| 4,171,242 | 10/1979 | Liu | 252/79.3 |

FOREIGN PATENT DOCUMENTS 53-46633 12/1978 Japan .................. 156/662

OTHER PUBLICATIONS

Jenkins, "A New Crystals" J. of Electrochemical Soc., vol. 124, No. 5 (5/77) pp. 757-762.

*Primary Examiner*—Jerome W. Massie
*Attorney, Agent, or Firm*—Staas & Halsey

[57] ABSTRACT

A surface or surfaces of a semiconductor substrate are roughened by etching the substrate with an etchant containing (i) hydrofluoric acid, ammonium fluoride and/or acid ammonium fluoride, (ii) at least one manganese- or chromium-containing oxidizing agent, such as potassium permanganate, potassium manganate, chromium trioxide, potassium or sodium chromate and potassium or sodium dichromate, and (iii) an alkali. If a rougher surface or surfaces are desired, the substrate is pre-etched with an etchant containing (i) the fluorine-containing compound and (ii) the manganese-containing oxidizing agent, and then, etched with the above-mentioned etchant.

10 Claims, 11 Drawing Figures

METHOD OF SURFACE-TREATING SEMICONDUCTOR SUBSTRATE

BACKGROUND OF THE INVENTION (1) Field of the Invention

This invention relates to surface treatment of a semiconductor substrate, i.e., a wafer. More particularly, it relates to a method for roughening a surface of a semiconductor substrate by an etching technique.

(2) Description of the Prior Art

In order to reduce the thermal resistance and collector parasitic resistance of a semiconductor device, or enhance the adhesion strength of a semiconductor element to an electrode metal or to a package, it is necessary, in the course of manufacturing the semiconductor device, to reduce the thickness of the semiconductor substrate to the desired value, i.e., usually 100 to 200 microns, and further, to roughen the back surface of the semiconductor substrate. By the term "back surface", used herein, is meant a surface of the semiconductor substrate opposite to the surface at which circuit elements formed in the substrate are exposed. The above-mentioned reduction in thickness and roughening of the back surface have been heretofore effected by sanding the back surface of the semiconductor substrate by using an abrasive material and a sanding machine. It is unavoidable, however, that the so-sanded semiconductor substrate is subjected to an etching treatment to remove the residual abrasive material from the substrate and, also, to remove the strained thin surface layer from the substrate. Such an etching treatment undesirably smooths the roughened back surface to some extent and requires a substantially long period of time. Furthermore, the size of the semiconductor substrate has recently become large, i.e., its diameter being from 75 to 100 mm. Therefore, the above-mentioned sanding of the semiconductor substrate is liable to damage the semiconductor substrate and, thus, the sanding operation requires special caution and is troublesome.

SUMMARY OF THE INVENTION

It is, therefore, the main object of the present invention to provide a method of roughening a surface of a semiconductor substrate whereby the roughening can be easily and effectively conducted.

In accordance with the present invention, a surface or surfaces of a semiconductor substrate is roughened by the method wherein the surface or surfaces of the semiconductor is brought into contact with an etchant having contained therein (i) at least one fluorine-containing compound selected from the group consisting of hydrofluoric acid (HF), ammonium fluoride ($NH_4F$) and acid ammonium fluoride ($NH_4HF_2$), (ii) at least one manganese- or chromium-containing oxidizing agent and (iii) and alkali.

DESCRIPTION OF THE PREFERRED EMBODIMENTS

Figure 2A:
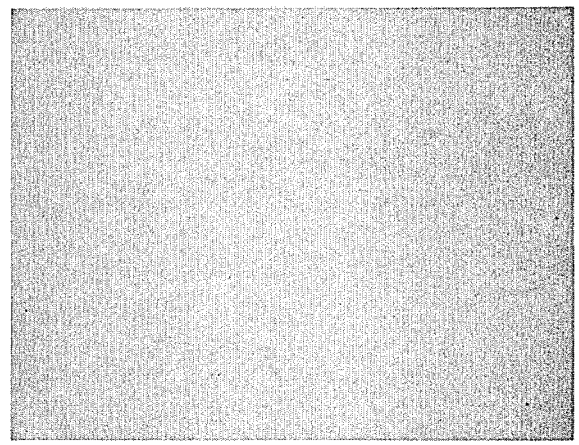

Prior to the etching treatment, wherein the above-mentioned etchant is used, a semiconductor substrate is usually pre-treated so that its thickness is reduced to the desired value, for example, approximately 200 microns. Such pre-treatment may be effected by immersing the semiconductor substrate in a mixed solution of hydrofluoric acid (HF) and nitric acid ($HNO_3$) in such a manner that the back surface of the substrate is etched by the mixed solution. The so-etched back surface is smooth, as illustrated in FIG. 2A.

The oxidizing agent contained in the etchant used in the method of the invention includes, for example, manganese-containing oxidizing agents such as potassium permanganate ($KMnO_4$) and potassium manganate ($K_2MnO_4$), and chromium-containing oxidizing agents such as chromium trioxide ($CrO_3$), potassium chromate ($K_2CrO_4$), potassium dichromate ($K_2Cr_2O_7$), sodium chromate ($Na_2CrO_4$) and sodium dichromate ($Na_2Cr_2O_7$). These oxidizing agents may be used either alone or in combination. The alkali used includes, for example, potassium hydroxide (KOH) and sodium hydroxide (NaOH).

The reason the back surface of the semiconductor substrate can be desirably roughened by using the etchant containing the above-mentioned oxidizing agent cannot be clearly elucidated, but it is presumed that silicon is oxidized by the oxidizing agent, whereby a layer of $SiO_2$ is formed and hydrated silicon dioxide ($mSiO_2 \cdot nH_2O$) is built up on the surface of the substrate. Thus, the etchant cannot be uniformly contacted with the entire silicon surface and penetrates through minute gaps present in the built-up hydrated silicon dioxide, so that the silicon dioxide surface layer is partially removed in a vermiculate manner by hydrofluoric acid or another fluorine-containing compound.

The composition of the etchant used in the method of the invention may suitably be varied depending upon the intended roughness of the semiconductor substrate. It is preferable that the respective ingredients in the etchants fall within the ranges: fluorine-containing compound = 7% to 38% by weight, more preferably 13% to 35% by weight, manganese- or chromium-containing oxidizing agent = 2.5% to 7% by weight, more preferably 3% to 7% by weight, and alkali = 1% to 10% by weight, more preferably 1% to 7% by weight. When the concentrations of the respective ingredients are outside these ranges, the substrate is liable to be non-uniformly roughened.

The conditions under which the semiconductor substrate is etched may suitably be varied depending upon the particular composition of the etchant and the intended roughness of the semiconductor substrate. In general, the semiconductor substrate may be immersed in the etchant at a temperature of approximately 20° to 25° C. for a period of from 10 seconds to 1 minute.

After the etching treatment, the semiconductor substrate is washed for removing the oxidized product built up on the back surface thereof and a manganese or chromium ingredient adsorbed on the back surface. For example, the etched substrate is washed with deionized water by ultrasonic cleaning for approximately two minutes to remove the oxidized product, and thereafter, the washed substrate is immersed in hydrofluoric acid for approximately one minute and, further, in a mixture of 30 parts by volume of nitric acid ($HNO_3$), one part by volume of hydrofluoric acid (HF) and 10 parts by volume of acetic acid (CH₃COOH) to remove the adsorbed manganese or chromium ingredient.

The semiconductor substrate etched by the method of the invention has a uniformly and finely roughened back surface. This semiconductor substrate is suitable for the manufacture of, for example, a high frequency power transistor wherein a eutectic crystal of gold (Au) and silicon (Si) is formed on the roughened back surface thereof and, then, the eutectic crystal-formed surface is bonded to a surface of a stem. However, if a semiconductor substrate having a rougher surface is desired (the degree of roughness of which is greater than that of the substrate suitable for a high frequency power transistor), it is preferable that, prior to the above-mentioned etching treatment, the substrate be pre-etched by using an etchant containing (i) at least one compound selected from hydrofluoric acid (HF), ammonium fluoride (NH$_4$F) and acid ammonium fluoride (NH$_4$HF$_2$) and (ii) a manganese-containing oxidizing agent such as potassium permanganate (KMnO$_4$) and potassium manganate (K$_2$MnO$_4$). The composition of the etchant used for the pre-etching treatment may also be suitably varied depending upon the intended roughness. In general, the concentration of the fluorine-containing compound and that of the manganese-containing compound may be in the ranges of from approximately 15% to 30% by weight and from approximately 5 to 7% by weight, respectively. The pre-etching conditions may also be varied depending upon the particular composition of the etchant used for pre-etching and the intended roughness. Usually, the pre-etching is carried out at a temperature of from approximately 20° to 25° C. for a period of from 10 seconds to one minute.

The semiconductor device, which has been pre-etched in the above-mentioned manner and, then, etched by the method of the invention, has a very rough back surface. The semiconductor substrate is suitable for the manufacture of, for example, a power transistor wherein a metal layer or layers are formed on the roughened back surface thereof and, then, the back surface is bonded to a stem by soldering.

The preferred embodiments of the method of the present invention will be further described by way of the following examples with reference to the accompanying drawings.

EXAMPLE 1

Manufacture of a Power Transistor

Figure 1A:
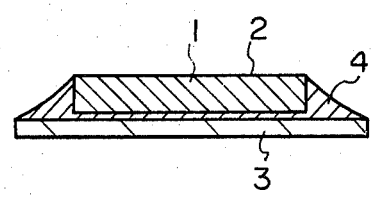
FIG. 1A through FIG. 1F schematically represent, in cross-section, the sequential steps of manufacturing a power transistor according to the method of the present invention; and, FIG. 2A through FIG. 2E illustrate micrographs of a 100× magnification showing the surface appearance of silicon substrates.

Referring to FIG. 1A, a silicon substrate (wafer) 1 of approximately 400 microns in thickness was prepared by conventional means. The substrate had a plurality of transistor elements formed therein, each element having an emitter region, a base region and a collector region, formed inside the silicon substrate, and electrodes connected to the base and emitter regions, formed on one predominant surface of the silicon substrate. The silicon substrate 1 was adhered to a glass plate support 3 by using an Electron (trade name) was binder 4, so that the other predominant surface, i.e., the back surface 2 of the substrate faced upward.

Figure 1B:
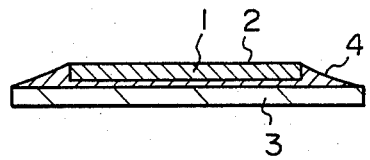

Referring to FIG. 1B, the substrate 1 was immersed in an etchant comprised of hydrofluoric acid (HF) and nitric acid (HNO$_3$), whereby the back surface 2 was etched so that the thickness of the substrate 1 was reduced to approximately 200 microns. The so-etched back surface 2 was smooth as indicated in the photograph illustrated in FIG. 2A.

Using an aqueous 9 weight % potassium permanganate (KMnO$_4$) solution, an aqueous 17 weight % potassium hydroxide (KOH) solution and an aqueous hydrofluoric acid (HF) solution, the following two etchants A and B were prepared.

|  | Parts by volume |
|---|---|
| A (pre-etching solution): | |
| Aqueous KMnO$_4$ solution | 12 |
| Aqueous HF solution | 10 |
| B (main etching solution): | |
| Aqueous KMnO$_4$ solution | 10 |
| Aqueous HF solution | 10 |
| Aqueous KOH solution | 4 |

Figure 1C:
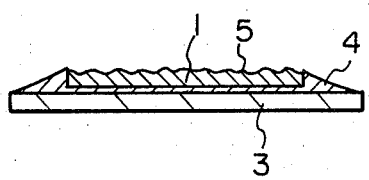
Figure 2B:
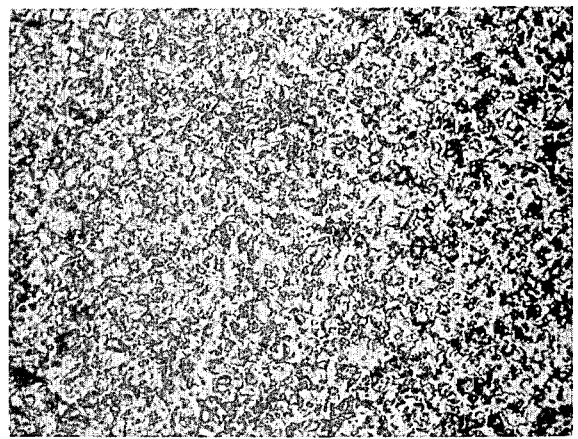

The substrate 1 of approximately 200 microns in thickness as adhered to the support 3 was subjected to a pre-etching treatment by immersing it in the etching solution A, at room temperature, for approximately 50 seconds. The back surface 5 of the pre-etched substrate 1 was very rough (FIG. 1C and FIG. 2B).

Figure 1D:
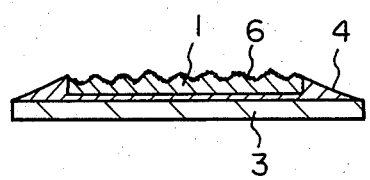
Figure 2C:
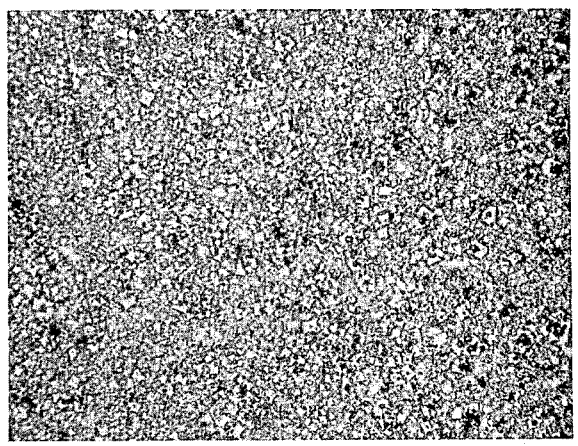

The pre-etched substrate 1 as adhered to the support 3 was then subjected to a main etching treatment by immersing it in the etching solution B, at room temperature, for approximately 60 seconds. The etched substrate 1 had a relatively uniformly and finely roughened back surface 6 as illustrated in FIG. 1D and FIG. 2C.

Figure 2D:
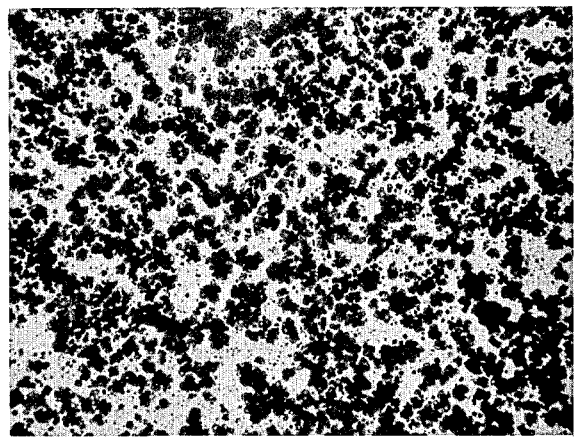

Thereafter, the substrate 1 was washed with deionized water by ultrasonic cleaning for approximately two minutes, immersed in an aqueous hydrofluoric acid solution for approximately one minute and, then, immersed in a mixed solution of 30 parts by volume of nitric acid, one part by volume of hydrofluoric acid and 10 parts by volume of acetic acid. The so cleaned back surface had an appearance as shown in FIG. 2D. The surface roughness thereof was approximately the same as that of the back surface mechanically sanded in a conventional manner by using an abrasive material having a particle size of 1,200 mesh.

Figure 1E:
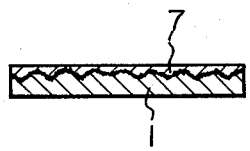

The silicon substrate 1 was then separated from the support 3 and, thereafter, washed with trichloroethylene to remove the wax from the substrate 1. Thereafter, a metal layer 7 was built up on the rough back surface of the substrate 1 to form an electrode connected to the collector region (FIG. 1E).

It should be noted that the information of the collector electrode 7 may be effected by conventional means, such as electron beam evaporation, sputtering and plating. The collector electrode 7 may also be a two layer structure comprised of, for example, an underlying titanium layer and an upper nickel layer, or an underlying chromium layer and an upper silver layer. The metal layer structure may be suitably varied so as to obtain ohmic contact, and further, in consideration of the brazing material used for bonding the power transistor element to a stem.

Figure 1F:
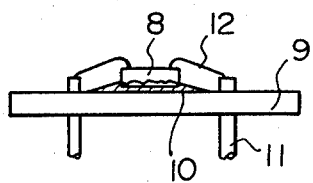

After the electrode was connected to the collector region as described above, the transistor elements formed in the silicon substrate 1 were tested for their electrical properties. Thereafter, the silicon substrate 1 was subjected to dicing to be thereby divided into the discrete transistor elements (chips) 8. Each of the transistor elements 8 which satisfied the acceptance criteria was mounted on a metal stem 9 by using a solder 10, so that the metal layer formed on the roughened back surface faces the stem 9 (FIG. 1F). Terminal leads 11 were connected to the emitter electrode (not shown) and the base electrode (not shown) by aluminum wirings 12 (FIG. 1F). Thereafter, a metal cap (not shown) was bonded to the stem 9 so that the transistor element 8 was airtightly sealed.

The above-mentioned method of manufacturing a power transistor, wherein the silicon substrate is chemically etched, is advantageous over the conventional method, wherein the silicon substrate is mechanically sanded, for the following reasons. First, when the substrate is mechanically sanded, the abrasive material used remains on the substrate and, further, a strained thin surface layer is undesirably formed on the substrate. The chemical etching of the invention does not have these defects. Secondly, the mechanical sanding is liable to damage the substrate. In contrast, the chemical etching of the invention (i.e., the sequential steps illustrated in FIG. 1A through FIG. 1B) is carried out by maintaining the substrate in an etchant bath in a stationary state and, thus, even when the substrate is very thin, the etching causes no damage to the substrate. It should be noted that the power transistor manufactured by the method of the invention is similar to that manufactured by the conventional mechanical sanding procedure in the forward characteristics, such as the collector-emitter saturated voltage $V_{CE}(sat)$, and also, in the bond strength between the collector electrode and the silicon substrate.

EXAMPLE 2

Manufacture of a High Frequency Power Transistor.

Figure 2E:
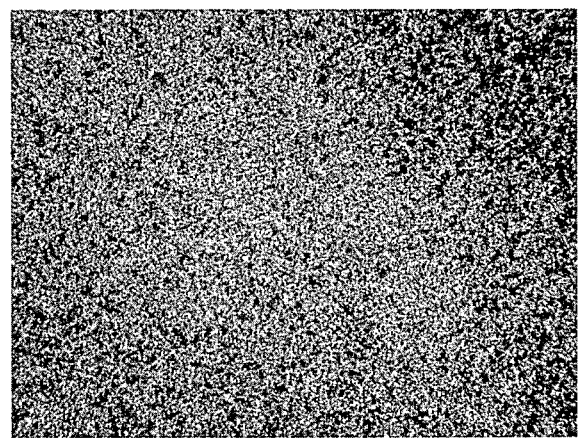

A silicon substrate having transistor elements formed therein was etched to a thickness of approximately 120 microns in a manner similar to that in EXAMPLE 1 (FIG. 1B). The substrate, after being adhered to the support 3, was subjected to etching (no pre-etching was conducted) by immersing it in a etching solution having the same composition as that in Example 1, whereby the back surface thereof was roughened. The etched substrate was washed with deionized water by ultrasonic cleaning, immersed in an aqueous hydrofluoric acid solution and then, immersed in a mixed solution similar to that used in EXAMPLE 1, whereby a silicon substrate having a uniformly and finely roughened back surface (FIG. 2E) was obtained. High frequency power transistors were made from the silicon substrate by conventional means.

It should be noted that, in the manufacture of high frequency power transistors, the thickness of a silicon substrate is usually reduced to 100 to 150 microns, in order to reduce the thermal resistance of the transistors. However, a silicon substrate cannot be sanded to such a thin thickness by the conventional sanding procedure without damaging the substrate. In contrast, the chemical etching of the invention enables reduction of the thickness of the substrate to 100 to 150 microns without damage to the substrate.

Various modifications can be implemented with regard to the embodiments illustrated in the above examples. For example, in the case where the roughened back surface of transistor elements is bonded to a package by using a low temperature melting glass in the manufacture of integrated circuits, the silicon substrate as etched is washed with deionized water by ultrasonic cleaning and, then, immersed in an aqueous hydrofluoric acid solution in a manner similar to that mentioned in Example 1 or 2, and the step of immersing the substrate in the mixed $HNO_3/HF/CH_3COOH$ solution, mentioned in Examples 1 and 2, may be omitted. This is because there is no need of forming electrical contacts between the elements and the package.

Although the embodiments illustrated in the above examples are concerned with the manufacture of semiconductor devices, the method of the invention may be used in the manufacture of semiconductor substrates. For example, when a semiconductor substrate having one predominant rough surface is prepared, the semiconductor substrate may be etched by using the etchant in a manner similar to that mentioned in the above examples. It is also possible to prepare a semiconductor substrate having the two predominant rough surfaces. In this case, the etching of the substrate is carried out without adherence of the substrate to a support.

The main advantages of the invention are summarized as follows. First, no strained surface layer is formed on the semiconductor substrate. Secondly, even when the substrate is thin or of a large size, no damage is caused to the substrate. Thus, the yield of semiconductor devices is enhanced and their manufacturing process becomes simple.

I claim:

1. A method of roughening at least one surface of a silicon semiconductor substrate comprising the step of bringing each surface of the semiconductor substrate that is to be roughened into contact with an etchant comprising (i) at least one fluorine-containing compound selected from the group consisting of hydrofluoric acid (HF), ammonium fluoride ($NH_4F$) and acid ammonium fluoride ($NH_4HF_2$), (ii) at least one oxidizing agent selectively containing manganese and chromium, and (iii) an alkali.

2. The method of claim 1, wherein the etchant contains, based on the weight of the etchant, (i) 7% to 38% by weight of the fluorine-containing compound, (ii) 2.5% to 7% by weight of the manganese- or chromium-containing oxidizing agent and (iii) 1% to 10% by weight of the alkali.

3. The method of claim 1, wherein the etchant comprises, based on the weight of the etchant, (i) 13% to 35% by weight of the fluorine-containing compound and (ii) 3% to 7% by weight of the oxidizing agent.

4. The method of claim 1, 2 or 3, wherein the oxidizing agent is selected from the group consisting of potassium permanganate ($KMnO_4$) and potassium manganate ($K_2MnO_4$).

5. The method of claim 1, 2 or 3, wherein the oxidizing agent is selected from the group consisting of chromium trioxide ($CrO_3$), potassium chromate ($K_2CrO_4$), potassium dichromate ($K_2Cr_2O_7$), sodium chromate ($Na_2CrO_4$) and sodium dichromate ($Na_2Cr_2O_7$).

6. The method of claim 1, 2 or 3, wherein the alkali is potassium hydroxide or sodium hydroxide.

7. A method according to claim 1, 2 or 3, wherein prior to the step of bringing each surface of the semiconductor substrate to be etched into contact with the etchant, each said surface is subjected to a pre-etching by using an etchant comprising (i) at least one fluorine-containing compound selected from the group consisting of hydrofluoric acid (HF), ammonium fluoride ($NH_4F$) and acid ammonium fluoride ($NH_4HF_2$) and (ii) at least one manganese-containing oxidizing agent selected from the group consisting of potassium permanganate ($KMnO_4$) and potassium manganate ($K_2MnO_4$).

8. The method of claim 7, wherein the etchant used for the pre-etching comprises, based on the weight of the etchant, (i) approximately 15% to 30% by weight of the fluorine-containing compound and (ii) approximately 5% to 7% by weight of the manganese-containing oxidizing agent.

9. The method of claim 1 or 2, said semiconductor substrate comprising a wafer of at least 75 mm diameter, and said etching comprising etching one surface of said wafer down to a maximum thickness of 200 microns.

10. The method of claim 7, said substrate comprising a wafer of at least 75 mm diameter, and said etching comprising one surface of said wafer down to a maximum thickness of 150 microns.

* * * * *

UNITED STATES PATENT AND TRADEMARK OFFICE
CERTIFICATE OF CORRECTION

PATENT NO. : 4,294,651
DATED : 13 October 1981
INVENTOR(S) : SOHSHI OHMURA

It is certified that error appears in the above—identified patent and that said Letters Patent is hereby corrected as shown below:

```
Front Page, FOREIGN PATENT DOCUMENTS, after "New" insert
     --Preferential Etch for Defects in Silicon--.
Col. 1, line 58, "and" should be --an--.
Col. 2, line 58, "C." should be --C--.
Col. 3, line 34, "C." should be --C--;
        line 61, "was" should be --wax--;
        line 63, after "substrate" insert --,--.
Col. 4, line 36, "so cleaned" should be --so-cleaned--.
Col. 5, line 38, "a" should be --an--;
        line 43, "solution and then," should be
     --solution, and then--;
        line 62, "transistor elements" should be
     --a transistor element--;
        line 68, "Example" should be --EXAMPLE--.
Col. 6, line 2, "Examples" should be --EXAMPLES--;
        line 40, after "agent" insert --,--.
```

Signed and Sealed this

Second Day of March 1982

[SEAL]

Attest:

GERALD J. MOSSINGHOFF

Attesting Officer    Commissioner of Patents and Trademarks